United States Patent
Musialik et al.

(10) Patent No.: US 9,756,441 B2
(45) Date of Patent: Sep. 5, 2017

(54) DIGITAL WIRELESS AUDIO TRANSMISSION SYSTEM WITH OPTIMIZED DYNAMICS

(71) Applicant: Sennheiser electronic GmbH & Co. KG, Wedemark (DE)

(72) Inventors: Christoph Musialik, Küssaberg (DE); Tom-Fabian Frey, Braunschweig (DE); Andreas Hermerding, Schönau im Schwarzwald (DE); Thomas Musialik, Waldshut-Tiengen (DE); Sebastian Rieck, Eggingen (DE); Markus Thiele, Hannover (DE); Sven Wachtendorf, Wedemark (DE)

(73) Assignee: Sennheiser electronic GmbH & Co. KG, Wedemark (DE)

( * ) Notice: Subject to any disclaimer, the term of this patent is extended or adjusted under 35 U.S.C. 154(b) by 0 days.

(21) Appl. No.: 15/001,394

(22) Filed: Jan. 20, 2016

(65) Prior Publication Data

US 2016/0212557 A1    Jul. 21, 2016

(30) Foreign Application Priority Data

Jan. 21, 2015 (DE) .................. 10 2015 200 961

(51) Int. Cl.
*H03G 3/00* (2006.01)
*H04R 29/00* (2006.01)
(Continued)

(52) U.S. Cl.
CPC .......... *H04R 29/004* (2013.01); *H03G 7/002* (2013.01); *H04R 3/00* (2013.01); *H03G 3/3005* (2013.01);
(Continued)

(58) Field of Classification Search
CPC .... H04R 29/004; H04R 3/00; H04R 2430/01; H04R 2420/07; H04R 25/356; H03G 7/002; H03G 3/3005; H03G 7/007
(Continued)

(56) References Cited

U.S. PATENT DOCUMENTS

| 2007/0072169 A1* | 3/2007 | Peyvan | G01R 19/0092 435/4 |
| 2007/0225772 A1* | 9/2007 | Lahti | A61N 1/3752 607/37 |

FOREIGN PATENT DOCUMENTS

| DE | GB 1317466 | * 6/1970 | ........... G05B 19/184 |
| DE | 694 14 683 | 4/1999 | |

(Continued)

OTHER PUBLICATIONS

European Search Report dated Jun. 7, 2016 for Application No. 16 151 895.6.
(Continued)

*Primary Examiner* — Quynh Nguyen
(74) *Attorney, Agent, or Firm* — Haug Partners LLP (57) ABSTRACT

A digital audio transmission system, in particular a wireless microphone or wireless pocket transmitter system. The audio transmission system has at least one wireless transmitter and at least one wireless receiver. The wireless transmitter has an analog input, a digitally adjustable input potentiometer for adjusting the input gain, an analog/digital converter for converting the analog signals into digital signals, a digital signal processing unit for performing digital signal processing, and a digital or a digitally adjustable output potentiometer for adjusting the output gain. The digital signal processing unit is adapted to adjust the gain of the digital input potentiometer and/or the digital output potentiometer in such a way that the dynamic range of the analog/digital converter is optimally utilized.

26 Claims, 4 Drawing Sheets

(51) Int. Cl.
*H04R 3/00* (2006.01)
*H03G 3/30* (2006.01)
*H03G 7/00* (2006.01)
*H04R 25/00* (2006.01)

(52) U.S. Cl.
CPC .......... *H03G 7/007* (2013.01); *H04R 25/356* (2013.01); *H04R 2420/07* (2013.01); *H04R 2430/01* (2013.01)

(58) Field of Classification Search
USPC .................................................. 381/107, 77
See application file for complete search history.

(56) References Cited

FOREIGN PATENT DOCUMENTS

DE  60 2004 009 432  7/2008
WO  WO 2005/069249  7/2005

OTHER PUBLICATIONS

TLV320ADC3101—Low-Power Stereo ADC with Embedded miniDSP for Wireless Handsets and Portable Audio, Oct. 1, 2008, XP055273076.

Juan Pablo Alegre Perez et al ., "AGC Fundamentals", In: "Automatic Gain Control", Jan. 1, 2011, XP055273078; ISBN:978-1-4614-0167-4.

\* cited by examiner

DIGITAL WIRELESS AUDIO TRANSMISSION SYSTEM WITH OPTIMIZED DYNAMICS

The present application claims priority from German Patent Application No. 10 2015 200 961.0 filed on Jan. 21, 2015, the disclosure of which is incorporated herein by reference in its entirety.

FIELD OF THE INVENTION

It is noted that citation or identification of any document in this application is not an admission that such document is available as prior art to the present invention.

The present invention concerns a digital wireless audio transmission system, in particular a digital wireless microphone system or a digital pocket transmitter system.

The invention further concerns a signal detection and processing system having a digital/analog converter at the input.

A wireless audio transmission system, for example in the form of a wireless microphone system, typically comprises at least one wireless microphone which wirelessly transmits the detected audio signals. That term however is also used hereinafter to mean a pocket or body-pack transmitter without reference being explicitly made thereto at any point in the text. A pocket transmitter is a device to the input of which different signal sources can be connected, for example instruments which electronically produce the sound (synthesizers) but equally sound playback devices (CD players) and naturally also microphones. The wirelessly transmitted audio signals are received by a receiver and can then be subjected to subsequent audio processing. Wireless audio transmission is typically effected in an HF range (high frequency range). Particularly in the case of wireless audio transmission, artefacts are to be avoided in that case, which can typically occur in such systems by virtue of overdriving or underdriving. That can be achieved by an optimally set gain which is matched to the signal strength. That is typically effected by manual adjustment in the microphone or transmitter. Particularly in the case of audio signals with a large dynamic, that is to say with greatly variable levels, it is difficult to find the suitable or optimum setting of the gain. Often the gain has to be manually suitably re-adjusted at very loud or very quiet parts of the audio signal and that can in practice by implemented only with very great difficulty during an ongoing concert or performance as to do that the sound engineer would have to run on to the stage to the artist/user.

Wireless microphone systems with an analog input amplifier and internal digital signal processing often involve non-optimum setting of the input gain if the signal conditions at the input often change greatly. In that case it can happen that the dynamic range of an analog/digital converter and thus also subsequent signal processing is not put to optimum use. To ensure high-quality digital audio signal processing it is important to provide an optimum modulation level at the input of the analog/digital converter.

Figure 1:
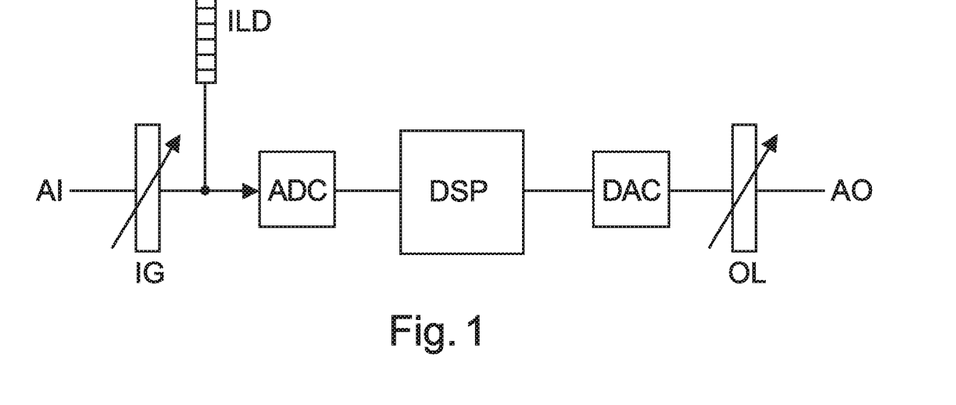
FIG. 1 shows a block circuit diagram of a digital signal processing arrangement in accordance with the state of the art.

FIG. 1 shows a diagrammatic general view of the system with digital signal processing according to the state of the art. An analog input AI is fed to an amplifier of adjustable sensitivity. The analog signal which is amplified in that way and adjusted in level is digitized in the analog/digital converter ADC. The digitized audio signal is subjected to audio processing in a digital signal processor DSP. The following digital/analog converter DAC implements conversion from a digital into an analog signal. The analog output signal of the digital/analog converter DAC can be adjusted in its gain by an adjustable amplifier OL (output level) so that the analog output signal AO can be passed at a suitable level to the next stage in the audio processing system.

In dependence on the input level the input gain IG is manually adjusted upstream of the analog/digital converter ADC so that the dynamic range of the analog/digital converter ADC, the subsequent signal processing means DSP (digital signal processor) and the subsequent digital/analog converter DAC can be put to optimum use. If the dynamic range is not fully utilized the result of this can be that only some few bits are addressed in the analog/digital converter ADC. If the input level of the audio signal upstream of the analog/digital converter is too low then typically the signal level at the output of the digital signal processor is increased, which can have the consequence that the signal-to-noise ratio is reduced. If on the other hand the level of the input audio signal is too high that can lead to overdriving or a hard limiting in respect of the signals in the analog/digital converter ADC. That is typically perceived as being unpleasantly distorted when a signal limited in that way is reproduced. The audio signal processing shown in FIG. 1 can have an input level display ILD in order to display the current level of the input signal to the user of the equipment. Having regard to that displayed input level manual adjustment of the input gain IG can then effected at the input amplifier. That may operate well if the dynamic of the input signal AI remains in a given range for a long period. Normally to achieve that the gain IG is optimally set during the so-called "sound check", but later however because of various circumstances it is often necessary to re-adjust the gain, which however is generally no longer possible as the sound engineer can no longer keep running on to the stage to the user.

The gain or sensitivity of a conventional wireless microphone can be implemented for example by adjustment of a potentiometer, adjustment of multi-position switches or actuation of plus and minus keys for controlling analog switches or multiplexers. Manual re-adjustment of the microphones is scarcely viable in practice if a plurality of wireless microphones are in operation at the same time in a system.

In the German patent application from which priority is claimed the German Patent and Trade Mark Office searched the following documents: WO 2005/069249 A1; DE 694 14 683 T2 and DE 60 2004 009 432 T2.

SUMMARY OF THE INVENTION

An object of the present invention is to provide a wireless audio transmission system, in particular a wireless microphone system, which offers an improved and/or automated adjustment option in respect of gain or input sensitivity.

Thus there is provided a digital audio transmission system, in particular a wireless microphone or wireless pocket transmitter system. The audio transmission system has at least one wireless transmitter and at least one wireless receiver. The wireless transmitter has an analog input, a digitally adjustable input potentiometer for adjusting the input gain, an analog/digital converter for converting the analog signals into digital signals, a digital signal processing unit for performing digital signal processing, and a digital or a digitally adjustable output potentiometer for adjusting the output gain. The digital signal processing unit is adapted to adjust the gain of the digital input potentiometer and/or the digital output potentiometer in such a way that the dynamic range of the analog/digital converter is optimally utilized.

According to an aspect of the present invention the gain of the digital or digitally adjustable output potentiometer is opposite to the gain of the input potentiometer.

According to a further aspect of the present invention the adjustment of the gain of the digital input potentiometer is effected in such a way that the number of effective bits which are used by the analog/digital converter, the subsequent signal processing system and the digital/analog converter is increased. The change in the gain at the digital output potentiometer compensates for the shift in the gain at the input so that the gain of the overall system is not influenced by optimization of the dynamic.

The wireless microphone system or wireless pocket transmitter system (wireless audio transmission system) according to the invention permits simplified handling and optimization of the sound quality. According to the invention optimum modulation of the wireless microphone system is made possible even with a greatly changing input level. In addition amplifier or manual sensitivity adjustment is no longer necessary.

The invention also concerns signal processing systems which require sensitivity adaptation at the input in order to permit optimum use of the dynamic range of the system. As an example from the audio field, mention could be made here of the graphic equalizer which is set up in an adjoining room and therefore cannot be easily reached just at any time by the sound engineer.

The invention concerns a concept of providing an automatic mechanism with constant gain for a digital system which digitally processes analog input signals. According to the invention automatic and optimum modulation of a digital dynamic range of a processing system is ensured, which operates with analog/digital conversion at the input and optionally digital/analog conversion at the output. A digital audio system can for example involve analog/digital conversion at the input but a digital output. In this connection optimum modulation means that the dynamic range of a typical signal processing chain (analog/digital converter, signal processing and optionally digital/analog converter) is put to optimum use. Usually a level is set with a safety margin (modulation reserve), which can be selected by a user. It is thus possible to provide a high audio quality in regard to a signal-to-noise ratio with a predetermined dynamic range for the system.

DETAILED DESCRIPTION OF EMBODIMENTS

It is to be understood that the figures and descriptions of the present invention have been simplified to illustrate elements that are relevant for a clear understanding of the present invention, while eliminating, for purposes of clarity, many other elements which are conventional in this art. Those of ordinary skill in the art will recognize that other elements are desirable for implementing the present invention. However, because such elements are well known in the art, and because they do not facilitate a better understanding of the present invention, a discussion of such elements is not provided herein.

The present invention will now be described in detail on the basis of exemplary embodiments.

Figure 2:
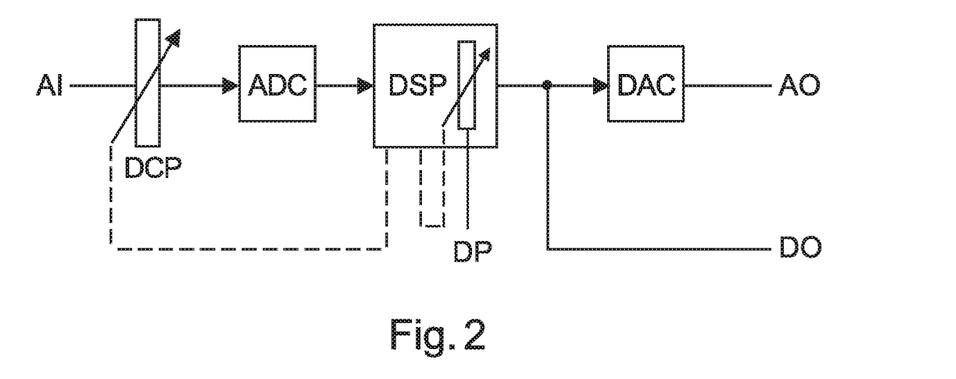
FIG. 2 shows a block circuit diagram of a signal processing arrangement according to a first embodiment.

FIG. 2 shows a block circuit diagram of a signal processing arrangement according to a first embodiment. The digital signal processing unit according to the first embodiment can optionally represent a wireless microphone system and has an analog input AI, a digitally adjustable analog potentiometer DCP, an analog/digital converter ADC, a digital signal processing unit DSP, a digital/analog converter DAC and an analog output AO and a digital output DO. The digitally adjustable potentiometer DCP serves to automatically set an optimum average level (having regard to the required modulation reserve) of the signal. The analog/digital converter ADC serves to convert an analog signal into a digital signal. Besides other signal processing tasks the digital signal processing unit DSP analyzes the input signal level and controls the digitally adjustable potentiometer DCP. Control is effected in particular to provide for optimum modulation of the analog/digital converter ADC. A possible change in the input signal level at the analog input AI can be compensated by the adjustment of the digitally adjustable potentiometer DCP. Adjustment of the digitally adjustable potentiometer is calculated in the digital signal processing unit DSP. In particular that can be implemented in such a way that the transfer function between input and output is always of the same magnitude. That is effected by compensation of the set gain by the digital potentiometer DP in the signal processing unit DSP. In that respect it is immaterial whether a digital potentiometer is simulated here or whether compensation is represented by a multiplier or in another form. The sole important consideration is that compensation is effected so precisely that no additional interferences are produced in the audio signal. The output signal can be in the form of an analog output signal AO and/or a digital output signal DO.

Provided that adjustment of the input signal with the potentiometer DCP takes place over a sufficiently great range then with such systems it is possible to completely dispense with a (further) manually adjustable input potentiometer (input adjuster). That represents an enormous advantage precisely in the case of wireless microphone systems and pocket transmitters for on-stage use.

Figure 3:
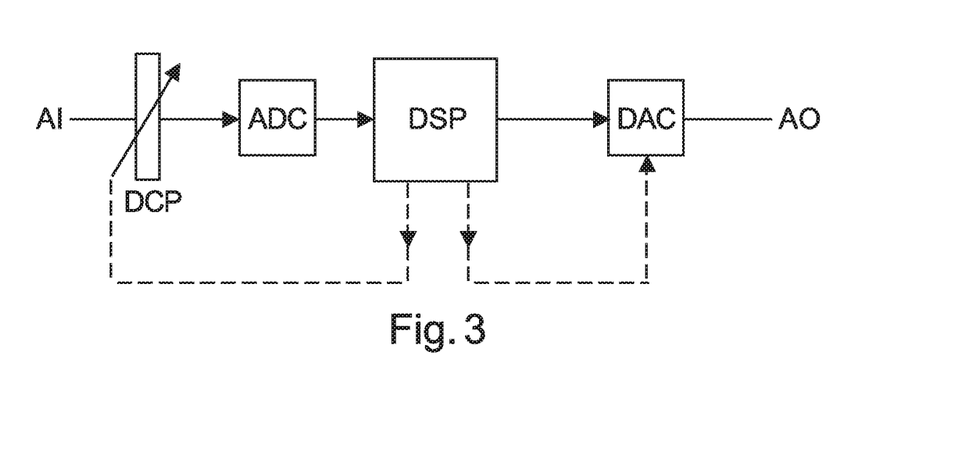
FIG. 3 shows a block circuit diagram of a signal processing arrangement according to a second embodiment.

FIG. 3 shows a block circuit diagram of a digital signal processing arrangement according to a second embodiment. The signal processing arrangement according to the second embodiment can be based on the signal processing arrangement of the first embodiment.

Instead of internal level compensation DP in the digital signal processing unit according to the first embodiment, the second embodiment provides that level adjustment is effected within the digital/analog converter DAC (there are digital/analog converters with an internal digitally adjustable potentiometer). That regulating adjustment is controlled by the signal processing unit DSP.

Figure 4:
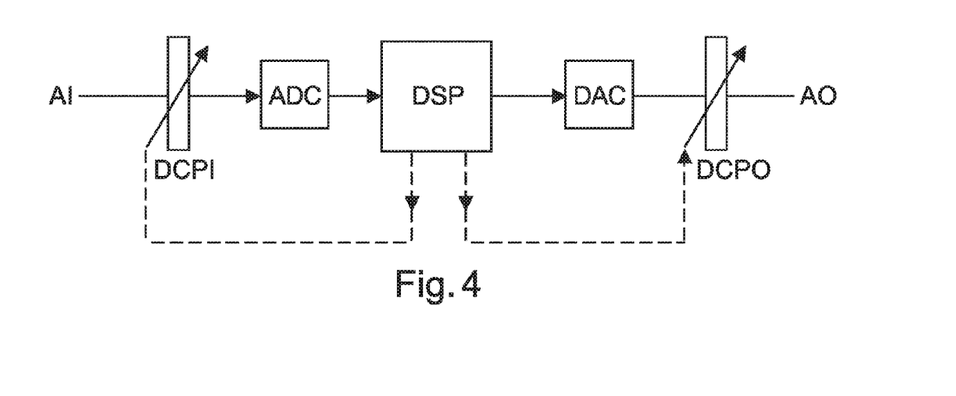
FIG. 4 shows a block circuit diagram of a signal processing arrangement according to a third embodiment.

FIG. 4 shows a block circuit diagram of a signal processing arrangement according to a third embodiment. The third embodiment can be based on the first and second embodiments. In contrast to the first and second embodiments the signal processing unit DSP in accordance with the third embodiment has both a digitally adjustable input potentiometer DCPI and also a digitally adjustable output potentiometer DCPO which are used in mirror image relationship for adjusting the input and output gain. The gain is adjusted by the digital signal processing unit DSP.

The third embodiment therefore takes account not only of the analog input but also the analog output and can thus lead to the optimum solution in terms of the signal-to-noise ratio. Pre-adjustment at the input potentiometer DCPI for gain adjustment is suitably compensated by the output potentiometer DCPO. Thus the gain or the relationship between the input and output signals remains constant over the entire processing chain. This embodiment with a digitally adjustable analog input and output potentiometer represents the optimum solution in terms of the signal-to-noise ratio. That is due to the fact that the simulation of a potentiometer in the digital domain (see DP in FIG. 2) always results in active bits being cut off and thus leads to a loss in dynamic of 6 dB/bit. Compensation at the analog level (see DCPO in FIG. 4) leads to lower losses in the dynamic range.

Figure 5:
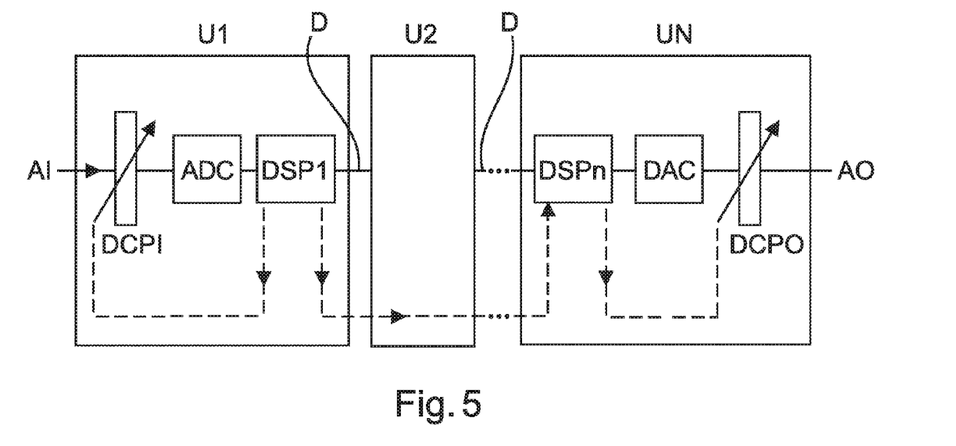
FIG. 5 shows a block circuit diagram of a signal processing arrangement according to a fourth embodiment.

FIG. 5 shows a block circuit diagram of a signal processing arrangement according to a fourth embodiment and is based on the third embodiment. It comprises a chain of signal-processing units U1 through UN (this can be a chain of devices). The first unit U1 includes an analog/digital converter (ADC), the further units U2, U3 and so forth each have a respective digital input and output, and the last unit UN includes a digital/analog converter (DAC). According to the invention the first unit includes automatic adjustment of an optimum gain or sensitivity which guarantees that the units U2, U3 and so forth and finally the last unit UN are optimally modulated. Compensation of the gain in accordance with the embodiment in FIG. 2 (implemented there with the digital potentiometer DP) is performed here in cross-system fashion with a digitally adjustable output potentiometer DCPO. The compensation signal is transmitted in synchronized form to the last unit UN. The value of the compensation can be embedded for example in the main signal. In the last unit UN the compensation control signal is output to the digitally adjustable output potentiometer DPCO UN.

The fourth embodiment (FIG. 5) can be for example in the form of a wireless microphone system with a transmitter and a receiver. In this case then the first unit U1 can be in the form of a wireless microphone and the last unit can be in the form of a wireless receiver. Thus a wireless system comprising a transmitter and a receiver, including HF transmission (high frequency or RF transmission) can be optimally actuated over the entire path and can thus automatically guarantee a high audio quality in the entire available dynamic range (see later FIG. 7). In the general case the units U2 through U(N−1) can be purely digital signal processing devices which in this arrangement are also automatically optimally controlled. The input signal with the acoustic information, that is brought into the right dynamic range by the switch position of the input potentiometer DCPI, is passed from the first unit U1 to the next unit and so forth as far as the last unit UN, wherein each unit appropriately processes the useful signal and passes that processed signal to the following unit UX. In addition the position of the input potentiometer DCPI is transmitted from the first unit U1 to the last unit UN so that the signal (which has then been processed a plurality of times) can also be brought thereby into the desired (original) dynamic range again, by virtue of the quasi-mirror-image adjustment of the output potentiometer DCPO. A shift in the dynamic range in the interposed units U2 through U(N−1) is not required as, by virtue of the described method, that is in the range which is optimum for digital processing. The information about the position of the input potentiometer DCPI can also be embedded in the acoustic useful signal; it does not inevitably have to be passed to the last unit by way of a separate channel.

To further improve the quality of the audio processing according to the invention it should be ensured that the digitally adjustable input and output potentiometers have available a sufficient number of switching stages to avoid for example switching clicks. The potentiometer stages can have for example a logarithmic or at least quasi-logarithmic characteristic. Optionally calibration of the stages can be effected if favorable potentiometers with a greater tolerance between the varieties are to be used. In this respect calibration is used to mean that the precise values of the potentiometers in the input and output are individually ascertained for each switching stage. That makes it possible to take account of the precisely ascertained value in the processing operation, instead of the adjusted value. That serves even in the case of high-grade potentiometers (with a low tolerance) to provide a further increase in accuracy and thus an increase in quality, but on the other hand can also be used to employ less expensive components which generally have greater deviations from the ideal configuration than higher-priced components. Such a calibration process can be effected for potentiometers involving any curve configuration, that is to say especially for linear, logarithmic or quasi-logarithmic. That calibration process can for example be effected automatically controlled by the signal processing unit DSP. If use is made of that automatic measurement procedure the calibration process can be repeated at certain intervals, for example each time that the installation is switched on (initialization process); by virtue of that measure it is possible to counteract time-induced changes in the components (aging) which as is known occur precisely with analog components to a substantially greater degree than digital components. That also provides for a long-term stability required by professional users in the analog part of the system.

To further improve the audio signal quality the switching operation between two stages of the digitally controlled potentiometer can be synchronized with a signal zero crossing. In that case a zero crossing represents the moment in time at which the amplitude of the analog signal crosses the x-axis, that is to say it is zero. If for example a change in the gain of the potentiometer occurs precisely at that moment in time (that is to say the signal level is very low) then the switching artefacts which possibly occur are not audible. In contrast, as soon as the digital potentiometer is switched over at any moment in time, that can have an audible negative effect (for example a click).

The control signal from the digital signal processing unit DSP to the input potentiometer has to be synchronized having regard to all relevant delays in the interface between the digital signal processing unit DSP and the digitally adjustable potentiometer.

The changes in gain in that automatic regulation should occur relatively slowly and smoothly in comparison with otherwise usual dynamic processes as are effected by a compressor, expander or limiter. According to the invention the micro- and macrodynamics are left substantially uninfluenced, in particular in the case of signals where transient distortions are to be avoided. That should be effected in particular in the case of high-quality audio processing.

Figure 6:
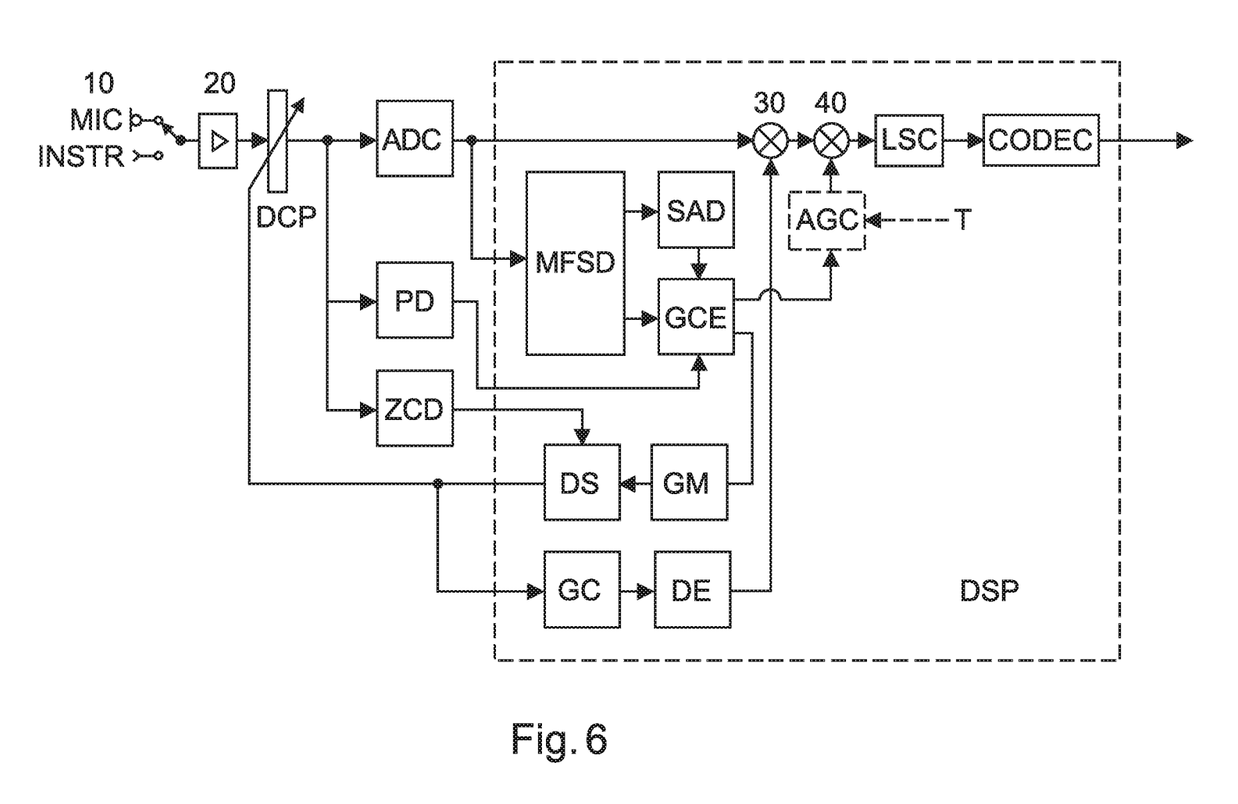
FIG. 6 shows a schematic block circuit diagram of a signal processing arrangement which can be used as a basis for the embodiments.

FIG. 6 shows a schematic block circuit diagram of a signal processing arrangement which can be used in the embodiments by way of example (FIGS. 2, 3, 4, 5 and 7). The signal processing arrangement in FIG. 6 is typically designed for a wireless microphone in the form of a hand microphone or as a pocket transmitter. The pocket transmitter can be connected to a microphone and can detect singing or music. Optionally a switch 10 can be provided at the input, in which case either a microphone MIC or an instrument INSTR can be connected to the analog input. The analog input audio signal can be amplified by a preamplifier 20 and can then be passed to a digitally adjustable potentiometer DCP. The output signal of the digital potentiometer DCP is passed to an analog/digital converter ADC. Provided at the output of the analog/digital converter ADC is a multi-functional signal detector MFSD which optionally analyzes the signal properties of the audio signal. The analyzed signal properties of the audio signal are passed to a signal activity detector SAD which serves to recognize a useful signal. The output signal of the signal detector MFSD is also passed to a calculation unit GCE (gain calculation) which calculates a gain correction factor for the digitally adjustable potentiometer DCP at the input. That gain correction factor should preferably represent a smooth signal gain factor, the calculating unit GCE providing for same. The output signal of the digitally adjustable potentiometer DCP (an analog signal) is passed to the peak detector PD. The output signal of the peak detector PD is passed to the gain calculation unit GCE. If the peak detector PD has detected a peak value which is above the limit value then a corresponding signal is output, which is detected by the gain calculation unit GCE and which provides that the gain of the digitally adjustable potentiometer DCP is reduced rapidly (virtually at once, without further delay). That is effected in particular if an unexpected signal rise has occurred downstream of the potentiometer. The signal activity detector SAD controls a rise or a fall in the gain of the digital potentiometer DCP in dependence on the presence or the absence of a desired signal (useful signal).

A particular processing operation should be effected in particular in two cases, namely if the signal level after the potentiometer rises extremely rapidly or if the desired signal is no longer present at the input. A level control algorithm of the digital signal processing unit DSP follows the tendency of the input signal and can generally prevent an unexpected increase in the input signal. On the other hand there can also be situations where an unexpectedly high rise in the signal level (for example interference like clicks or rumble) occurs, which cannot be compensated by the control algorithm in the normal mode. To avoid a hard limiting in respect of the signals in the digital/analog converter DAC there can be an analog peak detector PD at the output of the digitally adjustable potentiometer. The output signal of the peak detector can be used as a control signal for the control algorithm in the digital signal processing unit (GCE). In addition the output signal of the peak detector can be used to rapidly reduce the gain by the digitally adjustable potentiometer. Such an intervention in the control algorithm is better in terms of audio signal quality than the audible distortions caused by the hard limiting in the analog/digital converter ADC. In order to be sufficiently rapid that process can possibly use fast interrupt inputs of the DSP. That process is not linked to the clocked processing of the useful signal by the analog/digital converter and is therefore also not subject to the time delays which apply for that part of the processing procedure. Alternatively that functional part (differently from the situation shown in the drawing) can also be implemented outside the DSP by a separate hardware item.

In the other above-described situation it can occur that there is no longer an audio signal at the input. That can happen for example when a speaker or singer has just finished speaking or singing. In such a situation it can happen that the input gain is automatically increased more and more. That however also has the result that unwanted signals and thus also noise are amplified and become audible. If then the singer or speaker begins again to sing or speak that can in turn have the result that there is massive overdriving in the analog/digital converter ADC. Therefore a signal activity detector SAD can be provided, which monitors the input signal or the digitized input signal and decides whether a wanted signal (useful signal) is present at the input or not. Optionally instead of the signal activity detector SAD or in addition to the signal activity detector SAD there can be provided a voice activity detection unit VAD, in which respect care is to be taken to ensure that that unit is designed only to recognize speech activity (not shown in FIG. 6). Such a unit can not necessarily recognize other desired signals like for example singing or musical instruments. Optionally there can be provided a signal detector MFSD (multi-feature signal detector) which is used to analyze a combination of various signal characteristics. In addition the signal detector can be used to adjust the parameters of those signal characteristics in respect of the desired input signals. The signal detector can have for example a peak detector, an RMS detector, a zero crossing counter, a signal rise speed measuring device and so forth. In dependence on the output signal of the signal activity detector SAD a rise in the level at the input can be stopped if the signal activity detector SAD detects that there is not a wanted signal at the input.

The output signal of the gain calculation unit GCE can be passed to a gain map module GM which has stored the exact values of the digital potentiometer, which have been measured during a calibration process. The desired changes in the gain of the digitally adjustable potentiometer DCP however are only ascertained at the potentiometer when a zero crossing detector ZCD has detected a corresponding zero crossing. That zero crossing is passed from the zero crossing detector ZCD to a potentiometer synchronization unit DS which is coupled at its input to the output of the gain map module GM.

The value of the digitally adjustable potentiometer DCP can be included in the digital signal processing unit DSP for gain compensation of the digital potentiometer 30. The digital potentiometer 30 is actuated by the output of the potentiometer synchronization unit DS by way of a gain matching member or gain converter GC and a delay means DE such that the correct amplitude is set at the appropriate moment in time (synchronization). The compensation steps in the digital potentiometer 30 at the output are opposite (in mirror image relationship) to those of the digitally adjustable potentiometer DCP at the input. In that way it is also possible to permit an additional fixed gain factor between the digitally adjustable potentiometer at the input DCP and the digital potentiometer 30 at the output, whereby it is possible to provide a constant gain factor between the input and output, without a worsening of quality by the control algorithm. In that respect the manner of implementing the potentiometer 30 is immaterial (see above)—the only important consideration is compensating for the gain without in that respect distorting the signal.

The signal detector MFSD calculates control signals which can be used by an automatic gain control unit AGC to smooth the dynamic of the signal. That is effected for example by reducing the volume of loud signals and lifting quiet signals. That can optionally be effected based on desired targets T. The automatic gain control unit AGC can be used not to increase the gain if there are prolonged pauses in the desired signal. That can occur for example if the speaker ceases to talk for a prolonged period of time. For that purpose however it is advantageous if reliable signal activity detection can be effected. As in accordance with the invention there is already a signal activity detector SAD, that can be linked to the gain control unit AGC. The gain control unit AGC acts on the digital useful signal by way of the digital potentiometer 40. The way in which the potentiometer 40 is implemented is immaterial (see above) as long as no signal distortion occurs.

Optionally there can be provided a limiter/soft clip unit LSC. That unit serves to limit the output signal and possibly softly clip it if for example due to an unexpected signal change overdriving has occurred in the digital signal processing unit. Preferably that limiting is effected before the digital signal is passed to a digital codec and then is wirelessly transmitted by means of a high frequency transmitter HF as overdriving in the codec generally leads to markedly audible signal distortions. A codec is a usual method of encoding and decoding digital signals. The present invention provides that the codecs also profit from the process of dynamic optimization: the invention also makes it possible to use codecs with a relatively small dynamic extent (and are thus very inexpensive) in professional systems. The codec can advantageously be implemented in the DSP, it itself is not part of the invention but is known (state of the art). Instead of also implementing it in the DSP (as software) however it can also be embodied as an independent (integrated) circuit. Further digital signal processing (for example filtering)—if it is to be implemented in the DSP—can be effected according to respective suitability between the potentiometers 30 and 40, between the potentiometer 30 and the limiter LSC, between the limiter LSC and the codec or after the codec.

Figure 7:
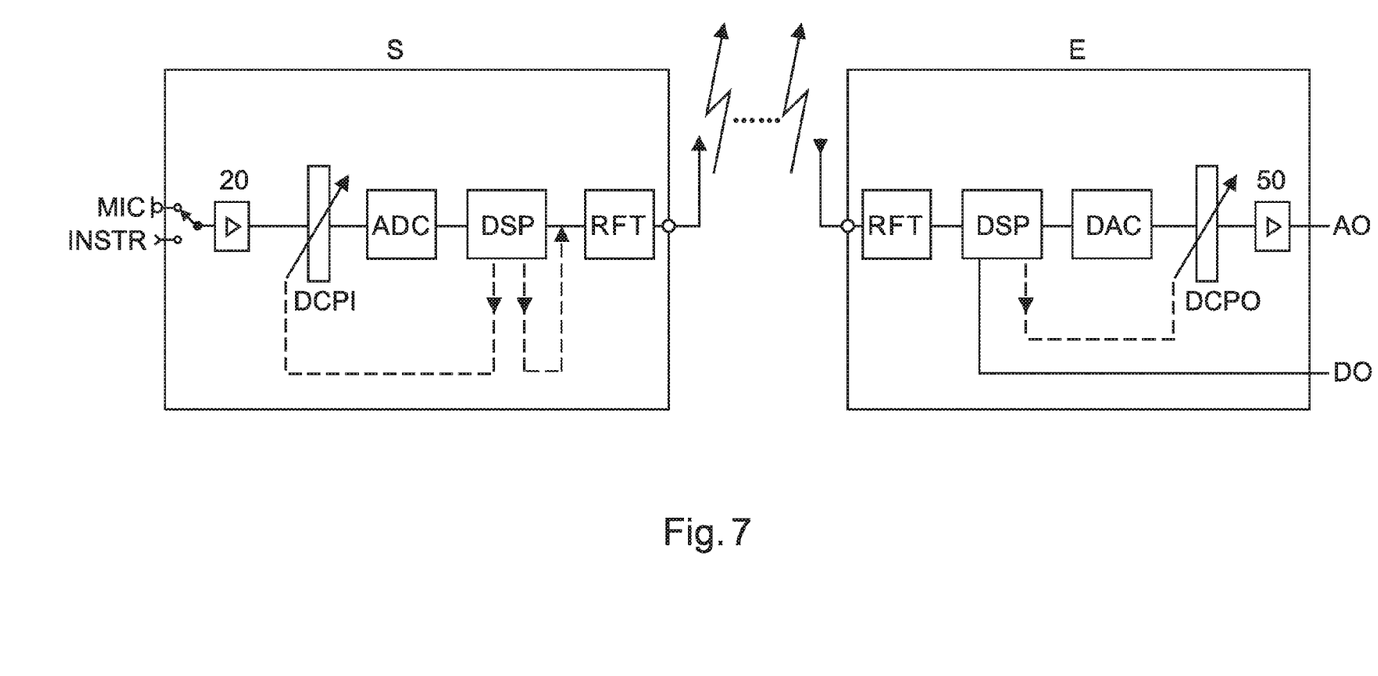
FIG. 7 shows a schematic view of a block circuit diagram of a wireless microphone system according to a fifth embodiment.

FIG. 7 shows a schematic block circuit diagram of a wireless microphone system according to a fifth embodiment. FIG. 7 shows a wireless transmitter S and a wireless receiver E. The wireless transmitter S can be in the form of a wireless microphone and transmits an audio signal by way of a wireless path. The wireless receiver E receives the wirelessly transmitted audio signal and passes it to a suitable signal processing means. The transmitter S of the fifth embodiment can be based for example on the signal processing unit shown in the block diagram of FIG. 6. Provided in the transmitter is a radio frequency transmitter RFT which serves to wirelessly transmit the digital and processed audio signal. Provided in the receiver E is a radio frequency receiver RFR for receiving the wirelessly transmitted audio signal. In the transmitter S the gain of the digitally adjustable potentiometer at the input DCPI is controlled by a signal processing unit DSP. That is effected as described in the first, second, third or fourth embodiment and as shown in the diagram in FIG. 6. A corresponding consideration applies to the receiver where the gain of the digitally adjustable potentiometer DCPO at the output is controlled by the signal processing unit DSP in the receiver. In that way the analog/digital converter as well as a digital data encoder in the transmitter is optimally actuated and more specifically as described in accordance with the preceding embodiments. According to the invention the data encoder and the data decoder are also implemented within the signal processing arrangement and thus profit from the advantage of optimum dynamic utilization according to the invention. That is advantageous because in that way it is also possible to use less expensive codecs (with a smaller specified dynamic range) without in that case limiting the quality of audio transmission. That automatic dynamic optimization also includes in a wireless microphone system the high frequency modules, the transmitter, the HF transmission path and the receiver. They are also optimally actuated and optimally modulated, which increases the reliability, acoustic quality and maximum possible distance (spacing between the antennas of the transmitter and the receiver) of a wireless system.

The digital processing unit can be represented by a digital signal processor. As an alternative thereto however the digital signal processing unit can also comprise an FPGA, a microprocessor, a computer or any other integrated circuit.

The method according to the invention permits optimum use of the dynamic range of the system. That is effected by adaptation of the analog gain at the input of the system, more specifically in such a way that as many bits as possible can be used in the analog/digital converter and the subsequent signal processing operation. At the output that shift is compensated so that the output level remains the same in relation to the input level independently of the dynamic shift within the system and thus permits a constant overall gain. This involves the system trying to automatically use the maximum possible number of bits of the system, more specifically irrespective of whether the amplitude of the input signal is small or large. Thus the signal-to-noise ratio of the system is permanently optimized and thus always maximized in the context of the available system dynamic. At the same time a system design according to the invention makes it possible to make optimum use of the high frequency path. That also has a limited dynamic range in which interference-free transmission is possible. That range is defined downwardly (low power levels) by the noise and interference in the high frequency range and upwardly (high power levels) inter alia by the available HF power or the HF power which is permissible in accordance with the applicable regulations.

If for example a weak input signal involves only four bits of the analog/digital converter then the subsequent signal processing cannot have more than a 24 dB dynamic if an initial dynamic is 6 dB/bit. If however in accordance with the invention modulation at the input of the digitally adjustable potentiometer is increased to for example 12 bits then subsequent signal processing can be effected with a dynamic of 72 dB. It should be noted that the signal-to-noise ratio of the input signal cannot be improved thereby if the input signal itself has a lower signal-to-noise ratio. It is assumed however that the analog preamplifier stages have a greater dynamic reserve than inexpensive analog/digital converters. If the input signal should exceed the modulation limit of the analog/digital converter then the gain at the digitally adjustable input potentiometer DCPI would be reduced to avoid distortion. That change in gain at the input can then be suitably compensated by the digitally adjustable potentiometer at the output DCPO.

According to the invention the regulation action of the method according to the invention should be set to be suitably smooth so that not only the macrodynamic of the system but also the microdynamic of the system is maintained. That is necessary in particular in the case of high-quality audio transmission systems in regard to the transient behaviour of the signals.

According to an aspect of the present invention the signal transit times can also be taken into account for actuation of the digital potentiometer DP or the digitally adjustable potentiometer DCPO in regard to the time of the converters ADC, DAC in the regulation procedure.

According to a further aspect of the present invention, if the digital signal processing means DSP wants to alter the value of the digital input potentiometer DCPI, that must be processed first. In addition thereto transmission of the new position to the potentiometer can last some time, for example a few microseconds. If the values of the digital input potentiometer DCPI are adjusted then that initially has an action only on the analog signals. The signal then has to additionally pass through the analog/digital converter and the further functional blocks before the altered signal occurs at the digital potentiometer DP or the digitally adjustable potentiometer DCPO and can be compensated there. Thus upon a change in the setting of the potentiometers it is also necessary to take account of the time sequence to avoid glitches which become audible because the compensation effect admittedly takes account of level compensation but that is not effected correctly in respect of time.

According to a further aspect of the present invention in particular in the case of a system which has a dynamic time variance (group delay of filters, amplifiers and so forth), time calibration also has to be effected, besides level calibration.

According to a further aspect of the present invention the blocks DCPI, DP, DCPO can also be implemented in the form of adjustable amplifiers, in which case the gain is to be controlled directly. Adjustment of the gain can be effected for example by a modulation signal PWM. In addition an analog control signal can regulate for the purposes of regulating the control for example a voltage controller amplifier and current controlled amplifier. For that purpose it may be necessary to provide a further digital/analog converter DAC.

According to a further aspect of the present invention the fundamental idea of the invention can also be expanded to other dynamic-limiting signal blocks or paths. That can represent digital or analog blocks.

While this invention has been described in conjunction with the specific embodiments outlined above, it is evident that many alternatives, modifications, and variations will be apparent to those skilled in the art. Accordingly, the preferred embodiments of the invention as set forth above are intended to be illustrative, not limiting. Various changes may be made without departing from the spirit and scope of the inventions as defined in the following claim.

The invention claimed is:

1. A digital wireless audio transmission system comprising:
at least one wireless transmitter; and
at least one wireless receiver;
wherein the wireless transmitter comprises:
an analog input;
a digitally adjustable input potentiometer configured to adjust the input gain;
an analog/digital converter configured to convert analog signals into digital signals; and
a digital signal processing unit configured to perform digital signal processing;
wherein the digital signal processing unit is adapted to adjust a gain of the digital input potentiometer in such a way that a dynamic range of the analog/digital converter is optimally utilized; and
wherein the adjustment of the gain of the digitally adjustable input potentiometer is effected during a zero crossing of an acoustic useful signal.

2. The wireless audio transmission system as set forth in claim 1;
wherein the wireless transmitter further comprises:
a digital or digitally adjustable output potentiometer;
wherein a gain of the digital or digitally adjustable output potentiometer is opposite to the gain of the input potentiometer.

3. The wireless audio transmission system as set forth in claim 2;
wherein the adjustment of the gain of the digital input potentiometer is effected in such a way that a number of effective bits which are used by the analog/digital converter, a subsequent signal processing system which has audio algorithms or codecs, and a digital/analog converter is increased; and
wherein the gain at the digital output potentiometer is adjusted to compensate for a shift in the gain at the input so that a gain of the overall system is not influenced by optimization of the dynamic.

4. The wireless audio transmission system as set forth in claim 1;
wherein:
calibration is effected for the digitally adjustable input potentiometer;
corresponding calibration values are stored; and
the corresponding calibration values are taken into consideration when calculating the mirror-image correction of the signals.

5. The wireless audio transmission system as set forth in claim 4;
wherein the calibration operation is performed automatically by the digital signal processing unit disposed in the circuit.

6. The wireless audio transmission system as set forth in claim 5;
wherein the calibration operation is automatically repeated at fixed time intervals.

7. A digital audio transmission system comprising:
at least one wireless transmitter;
and at least one wireless receiver;
wherein the wireless transmitter comprises:
an analog input;
a digitally adjustable input potentiometer configured to adjust the input gain;
an analog/digital converter configured to convert the analog signals into digital signals; and
a digital signal processing unit configured to perform digital signal processing;
wherein the digital signal processing unit is adapted to adjust a gain of the digital input potentiometer in such a way that a dynamic range of the analog/digital converter is optimally utilized;
wherein, by virtue of an abrupt severe rise in amplitude of an acoustic useful signal, a fresh adjustment of the digitally adjustable input potentiometer is very rapidly effected to prevent overdriving; and
wherein the very rapid actuation of the digitally adjustable input potentiometer is effected by an interrupt routine of the digital signal processing unit or an additional hardware specifically adapted thereto.

8. A method of controlling a digital wireless audio transmission system;
wherein the audio transmission system has:
a wireless transmitter; and
a wireless receiver;
wherein the wireless transmitter has:
an analog input;
a digitally adjustable input potentiometer configured to adjust the input gain;
an analog/digital converter configured to convert the analog signals into digital signals; and
a digital signal processing unit configured to perform digital signal processing;

wherein the method comprises the steps:
adjusting a gain of the digital input potentiometer so that a dynamic range of the analog/digital converter is optimally used;
wherein adjustment of the digitally adjustable input potentiometer is effected during a zero crossing of an acoustic useful signal.

9. A method of controlling a digital wireless audio transmission system;
wherein the digital wireless audio transmission system has:
a wireless transmitter; and
a wireless receiver;
wherein the wireless transmitter has:
an analog input;
a digitally adjustable input potentiometer configured to adjust the input gain;
an analog/digital converter configured to convert the analog signals into digital signals; and
a digital signal processing unit configured to perform digital signal processing; and
wherein the method comprises the steps:
adjusting a gain of the digital input potentiometer so that a dynamic range of the analog/digital converter is optimally used;
wherein, by virtue of an abrupt severe rise in amplitude of an acoustic useful signal, a fresh adjustment of the digitally adjustable input potentiometer is very rapidly effected to prevent overdriving; and
wherein the very rapid actuation of the digitally adjustable input potentiometer is effected by an interrupt routine of the internal digital processing unit or an additional hardware specifically adapted thereto, in particular a peak detector which reacts to positive and negative peaks.

10. The wireless audio transmission system as set forth in claim 2;
wherein:
calibration is effected for the digitally adjustable output potentiometer;
corresponding calibration values are stored; and
the corresponding calibration values are taken into consideration when calculating the mirror-image correction of the signals.

11. The wireless audio transmission system as set forth in claim 10;
wherein the calibration operation is performed automatically by the digital signal processing unit disposed in the circuit.

12. The wireless audio transmission system as set forth in claim 11;
wherein the calibration operation is automatically repeated at fixed time intervals.

13. The digital audio transmission system as set forth in claim 7;
wherein the very rapid actuation of the digitally adjustable input potentiometer is effected by an interrupt routine of a peak detector that reacts to positive and negative peaks.

14. The method of controlling a digital wireless audio transmission system as set forth in claim 9;
wherein the very rapid actuation of the digitally adjustable input potentiometer is effected by an interrupt routine of a peak detector which reacts to positive and negative peaks.

15. The digital wireless audio transmission system as set forth in claim 1;
wherein said acoustic useful signal includes a signal that is input to the analog/digital converter.

16. The digital wireless audio transmission system as set forth in claim 1;
wherein said acoustic useful signal includes a signal that is output by the digitally adjustable input potentiometer.

17. The method of controlling a digital wireless audio transmission system as set forth in claim 8;
wherein said acoustic useful signal includes a signal that is input to the analog/digital converter.

18. The method of controlling a digital wireless audio transmission system as set forth in claim 8;
wherein said acoustic useful signal includes a signal that is output by the digitally adjustable input potentiometer.

19. A digital wireless transmitter comprising:
an analog input amplifier;
a digitally adjustable input potentiometer receiving a signal from the analog input amplifier and being configured to adjust an input gain;
an analog/digital converter configured to convert an analog output signal of the digitally adjustable input potentiometer into a digital signal, wherein the analog/digital converter uses a clocked processing;
a peak detector configured to monitor the analog output signal of the digitally adjustable input potentiometer or the analog input signal of the analog/digital converter; and
a digital signal processing unit configured to perform digital processing of the digital signal provided by the analog/digital converter;
wherein the peak detector provides a signal to an interrupt input of the digital signal processing unit when a signal peak above a threshold is detected by the peak detector, and
wherein the digital signal processing unit, upon receiving said signal at said interrupt input, adjusts the digitally adjustable input potentiometer, independent of the clocked processing of the analog/digital converter.

20. The digital wireless transmitter as set forth in claim 19;
wherein the digital signal processing unit, upon receiving said signal at said interrupt input, adjusts the digitally adjustable input potentiometer before a next clock cycle of the analog/digital converter's processing.

21. The digital wireless transmitter as set forth in claim 19, further comprising:
a zero crossing detector configured to monitor the output signal of the digitally adjustable input potentiometer or an input signal of the analog/digital converter,
wherein the zero crossing detector controls adjustment of the digitally adjustable input potentiometer to be performed during a zero crossing of the monitored signal.

22. The digital wireless transmitter as set forth in claim 19;
wherein the digital signal processing unit further comprises a gain compensation unit adapted to compensate the input gain applied by the digitally adjustable input potentiometer.

23. A digital wireless microphone comprising a digital wireless transmitter as set forth in claim 19.

24. A digital wireless transmitter comprising:
an analog input amplifier;
a digitally adjustable input potentiometer receiving a signal from the analog input amplifier and being configured to adjust an input gain;

an analog/digital converter configured to convert an analog output signal of the digitally adjustable input potentiometer into a digital signal, wherein the analog/digital converter uses a clocked processing;

a zero crossing detector configured to monitor the analog output signal of the digitally adjustable input potentiometer or the analog input signal of the analog/digital converter; and a digital signal processing unit configured to perform digital processing of the digital signal provided by the analog/digital converter;

wherein the zero crossing detector provides a signal to an interrupt input of the digital signal processing unit when a change of a sign of the monitored signal is detected by the zero crossing detector, and wherein the digital signal processing unit, upon receiving said signal at said interrupt input, adjusts the digitally adjustable input potentiometer, independent of the clocked processing of the analog/digital converter.

25. The digital wireless transmitter as set forth in claim 24;

wherein the digital signal processing unit, upon receiving said signal at said interrupt input, adjusts the digitally adjustable input potentiometer before a next clock cycle of the analog/digital converter's processing.

26. A digital wireless microphone comprising a digital wireless transmitter as set forth in claim 24.

* * * * *